United States Patent [19]

Nagata et al.

[11] 3,805,348

[45] Apr. 23, 1974

[54] METHOD OF MAKING AN ENCAPSULATED PIEZOELECTRIC CERAMIC RESONATOR DEVICE

[75] Inventors: Takashi Nagata; Satoshi Kuwano; Reiichi Sasaki, all of Osaka, Japan

[73] Assignee: Matsushita Electric Industrial Co., Ltd., Osaka, Japan

[22] Filed: May 16, 1972

[21] Appl. No.: 253,872

Related U.S. Application Data

[62] Division of Ser. No. 170,515, Aug. 10, 1971.

[52] U.S. Cl. .................. 29/25.35, 310/8.2, 310/8.9, 310/9.1, 310/9.4

[51] Int. Cl. .................. B01j 17/00

[58] Field of Search ............ 29/25.35; 310/8.2, 8.9, 310/9.1, 9.2, 9.3, 9.4

[56] References Cited

UNITED STATES PATENTS

| | | | |
|---|---|---|---|
| 3,621,547 | 11/1971 | Durham, Jr. | 29/25.35 |
| 2,254,843 | 9/1941 | Grosdoff | 310/9.2 X |
| 2,635,199 | 4/1953 | Wolfskill | 29/25.35 X |
| 3,560,772 | 2/1971 | Lungo et al. | 310/9.4 |
| 1,924,297 | 8/1933 | Tillyer | 310/8.2 X |

FOREIGN PATENTS OR APPLICATIONS

| | | | |
|---|---|---|---|
| 1,541,491 | 1/1970 | Germany | 310/8.2 |

*Primary Examiner*—Charles W. Lanham
*Assistant Examiner*—Carl E. Hall
*Attorney, Agent, or Firm*—Wenderoth, Lind & Ponack

[57] ABSTRACT

A method of making a piezoelectric ceramic resonator device encapsulated in a glass housing. A lead wire is attached to a contact means, and then the wire is sealed into the closed end of a glass tube having the other end open by melting the area of the glass tube through which the lead wire extends. A piezoelectric ceramic body having two electrodes on opposite surfaces thereof is placed on the contact means with one electrode against the contact means and a resilient contact means combined with another lead wire is placed under a predetermined pressure against the other electrode on the piezoelectric ceramic body. The open end of the glass tube is then sealed around the other lead wire to form the glass housing which holds the resilient contact means at said predetermined pressure and which seals the piezoelectric ceramic body and the contact means into the glass housing in the air-tight condition.

4 Claims, 4 Drawing Figures

METHOD OF MAKING AN ENCAPSULATED PIEZOELECTRIC CERAMIC RESONATOR DEVICE

This application is a division of application Ser. No. 170,515 filed Aug. 10, 1971. This invention relates to a method of making an improved ceramic resonator device. In particular, it relates to a piezoelectric ceramic resonator sealed in a glass housing under a predetermined contact pressure.

It is well known that piezoelectric resonators such as crystal and ceramic resonators vibrate at an operating frequency. The resonators should be carefully mounted so as not to produce unwanted vibration responses due to the mounting system. In order to solve the problems relating to mounting, the resonators have often been supported under a resilient force of resilient treminals. Such a mounting means has been known as a pressure mounting.

Kuenstler discloses a typical pressure mounting device for a crystal resonator in U.S. Pat. No. 2,384,756, which was issued on Sep. 11, 1945. Birt et al. discloses a pressure mounting device for a plurality of crystal resonators in U.S. Pat. No. 2,639,393, issued on May 19, 1953. Heilman et al discloses a piezoelectric ceramic filter in which a plurality of ceramic resonators are resiliently mounted in U.S. Pat. No. 3,299,301, issued on Jan. 17, 1967. Pierce discloses a crystal mounting sealed in a glass package having a vacuum therein in U.S. Pat. No. 2,266,070 issued on Dec. 16, 1941.

Difficulty has been encountered in a glass housing due to a temperature problem because the Curie temperature of the piezoelectric ceramic material is below 600° C, as is disclosed in a paper entitled "Piezoelectric Transducer Materials," Proc. IEEE Vol. 53, No. 10, Oct. 1965, pp. 1372–1886, Table IV, by Jaffe and Berlincourt. Therefore, a ceramic resonator housed in a glass package has not been available as a practical matter.

It is therefore a primary object of the invention to provide a method of making a ceramic resonator resiliently supported at a predetermined pressure and sealed in air tight condition in a glass housing.

This object is achieved by providing a method of making a piezoelectric ceramic resonator device encapsuled in a glass housing in which a lead wire is attached to a contact means, and then the wire is sealed into the closed end of a glass tube having the other end open by melting the area of the glass tube through which the lead wire extends. A piezoelectric ceramic body having two electrodes on opposite surfaces thereof is placed on the contact means with one electrode against the contact means, and a resilient contact means combined with another lead wire is placed under a predetermined pressure against the other electrode on the piezoelectric ceramic body. The open end of the glass tube is then sealed around the other lead wire to form the glass housing which holds the resilient contact means at said predetermined pressure, and which seals the piezoelectric ceramic body and the contact means into the glass housing in an air-tight condition.

Other features and advantages will become apparent from the following description taken in connection with the drawings, in which.

Figures 1, 2, 3, 4:
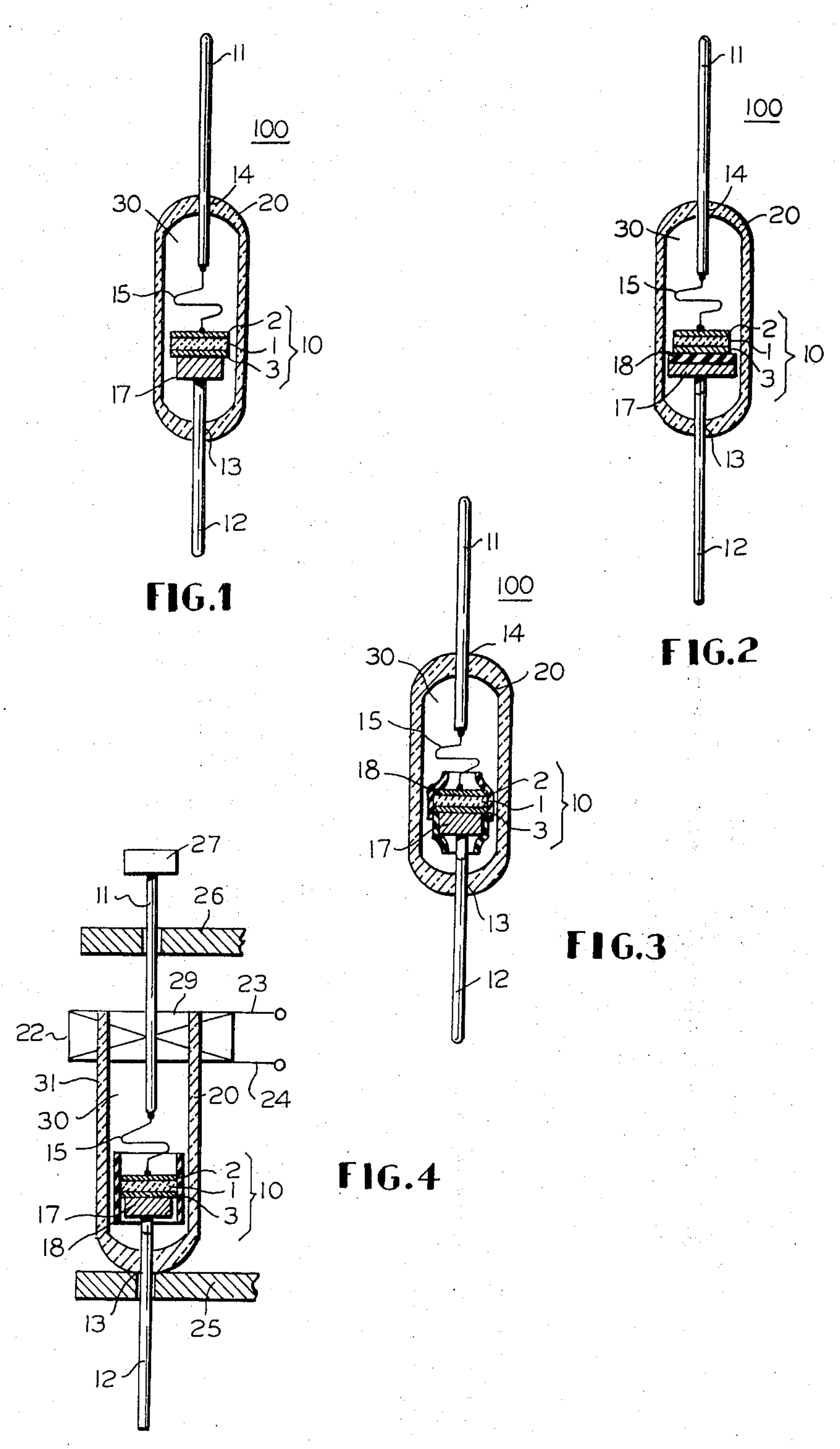
FIG. 1 is a cross-sectional view of an embodiment of a ceramic resonator device according to the present invention.
FIGS. 2 and 3 are cross-sectional views of modified forms of the ceramic resonator device according to the invention.
FIG. 4 is a schematic view illustrating the method of the present invention.

Referring to FIG. 1, a ceramic resonator device 100 comprises a ceramic resonator 10 and a glass housing 20. Said ceramic resonator is supported resiliently under a predetermined pressure at electrode surfaces 2 and 3 by a pair of contact means 15 and 17 to which electrical lead wires 11 and 12 are connected, respectivley. Said wires 11 and 12 extend through the wall of said glass housing 20, which is in air-tight sealing engagement around the lead wires at extensions 14 and 13 thereof.

The ceramic resonator 10 consists of a piezoelectric ceramic body 1 having the two electrodes 2 and 3 applied to opposite surfaces thereof. The ceramic resonator has a main resonance response at a selected frequency. It is necessary that the Curie temperature of the piezoelectric ceramic body be higher than 160° C so as to prevent disappearance of the piezoelectric activity after the resonator is sealed in the glass housing at a high temperature. Some piezoelectric ceramic materials suitable for such a resonator are solid solutions of lead-zirconate-titanate and/or modified solid solutions of such materials. A solid solution of lead-titanate and/or modified lead-titante is especially suitable, since its Curie temperature is usually above 400° C and relatively higher than that of other materials. The electrodes 2 and 3 are deposited on the related surfaces of the piezoelectric ceramic body by conventional methods such as firing of silver paint and/or electroless plating.

The contact means 17 is a head pair at the end of the lead wire 12. A flat surface of the head supports the resonator 10. The other contact means 15 is a whisker consisting of a fine Tungsten wire. One end of the whisker is in resilient point contact with the electrode surface 2, and the resonator 10 is stably supported between the point contact and the head by the resilience of the whisker. The other end of the whisker is fixed to an end of the lead wire 11. In this embodiment, the resonator 10 is supported by the pair of contact means in face and point contact. As a practical matter, contact means with face to face and/or point to point contact can also be made. One of the necessary conditions to support the ceramic resonator with the predetermined pressure is that the pair of contact means have at least one contact with resilient action in the longitudinal direction of the lead wires during the sealing process.

In order to get good glass seal, the thermal expansion coefficients of the lead wires 11 and 12 should be equal to that of the glass housing 20. For example, a combination in which the lead wires are of iron-nickel alloys and the glass housing is of a soft glass material produces good air-tight sealing. It is especially suitable to use a combination of Dumet wires and lead glass, as is disclosed in "Materials and Process of Electronic Devices," by Max Knoll, pp. 209 to 213, published by Springer-Verlag of Germany in 1959. The interior 30 of the glass housing 20 is filled with dried air so as to ensure a stable operation of the ceramic resonator. If a special atmosphere such as an inert gas is required, the interior 30 is easily filled with inert gas during the sealing process.

Referring to FIGS. 2 and 3, in which the modified forms of the device as shown in FIG. 1 are shown, like numbers designate the same parts of the device as in FIG. 1. In a piezoelectric ceramic resonator, some acoustic damping is often required for elimination of the spurious responses near the main resonance frequency. In FIG. 2, an acoustic damper 18 is sandwiched between the contact means 17 and the ceramic resonator 10. A good material for the acoustic damper 18 is a mixture of xylene, silicone rubber and silver powder. This material has good ability to eliminate spurious response and also has good electrical conductivity. As a practical example, a 10.7 MHz ceramic resonator vibrating in the thickness-shear mode can be successfully mounted using an acoustic damper made of a mixture of xylene, silicone rubber and silver powder, and the spurious responses can be eliminated. A mixture comprising 65 weight percent of xylene, 12 weight percent of silicone rubber, and 23 weight percent of silver powder is particularly good for eliminating the spurious responses when used for the acoustic damper.

FIG. 3 shows another embodiment of the acoustic damper 18 which is usable for the piezoelectric ceramic device according to the present invention. The acoustic damper 18 in FIG. 3 consists of a heat shrinkable plastic tube. A necessary condition for the plastic tube 18 is that it be shrinkable at a temperature below 180° C and that it fit around the periphery of the ceramic resonator 10. There are many plastics suitable for the acoustic damping tubes 18, such as Teflon, neoprene, polyethylene, as listed in a catalog "PENN TUBE BULLETIN" published by Pen Tube Plastic Co., Ltd. The acoustic damper is especially effective for a piezoelectric ceramic resonator vibrating in the thickness mode such as thickness-shear and thickness-extensional vibration at a frequency above one megahertz.

The piezoelectric ceramic device described hereinbefore can be satisfactorily produced by the following processes. One practical method for making the device will be described with reference to FIG. 4.

In FIG. 4, like numbers designate the same parts as in FIG. 3. The bottom of the glass housing 20 which is sealed around the lead wire 12 at the extension 13 is supported by a supporting means 25 so that the open end 29 of the glass tube 31 opens upwards. The ceramic resonator 10 is placed on the contact means 17 and the heat shrinkable plastic tube 18 is deposited around the periphery of the resonator. The lead wire 11 having the whisker 15 connected thereto is applied to the resonator 10 through a supporting guide 26 and the open end 29. The resilient pressure of the whisker 15 is determined by a weight 27 loaded on the top end of the lead wire 11. An electrical heating coil 22 is provided around the periphery of the glass tube 31 at the open end 29 thereof. With this arrangement, the resonator response can be checked using the pair of lead wires and the optimum supporting pressure can be selected by adjusting the weight 27. After all parts are arranged, the open end 29 of the glass tube 31 is sealed around the lead wire 11 by supplying electrical power to the coil 22 through electrical terminals 23 and 24. The temperature of the resonator 10 is kept between 100° C to 150° C during the sealing so as to fit the heat shrinkable tube 17 around the periphery of the resonator.

From the above description and the drawings of the embodiments chosen as exemplifications of the principles of the present invention, it will be clear to those skilled in the art that certain minor modifications and variations may be employed without departing from the essence and true spirit of the invention. Accordingly, it is to be understood that the invention should be deemed limited only by the fair scope of the claims that follow, and equivalents thereto.

What is claimed is:

1. A method for making a piezoelectric ceramic resonator device encapsuled in a glass housing, comprising the steps of attaching a lead wire to a contact means, sealing said lead wire into the closed end of a glass tube having the other end open by melting an area where said lead wire extends out through said glass tube, placing a piezoelectric ceramic body having two electrodes on opposite surfaces thereof on said contact means with one electrode against the contact means, placing a resilient contact means combined with another lead wire under a predetermined pressure against the other electrode on said piezoelectric ceramic body, and sealing by heating the open end of said glass tube around said other lead wire to form a glass housing which holds said resilient contact means at said predetermined pressure and which seals said piezoelectric ceramic body and said contact means into said glass housing in an airtight condition.

2. A method for making a piezoelectric ceramic resonator device as claimed in claim 1 further comprising placing a conductive rubber acoustic damper between said piezoelectric ceramic body and said contact means.

3. A method for making a piezoelectric ceramic resonator device as claimed in claim 1 wherein said method further comprises the step of inserting a heat shrinkable plastic tube between the periphery of said piezoelectric ceramic body and said glass tube before the step of placing said resilient contact means against said piezoelectric ceramic body.

4. A method for making a piezoelectric ceramic resonator device as claimed in claim 1 wherein said predetermined pressure is adjusted by placing a weight on the free end of said other lead wire.

* * * * *